(12) United States Patent
Jeong et al.

(10) Patent No.: US 9,659,644 B2
(45) Date of Patent: May 23, 2017

(54) DRIVING METHOD OF NONVOLATILE MEMORY DEVICE USING VARIABLE RESISTIVE ELEMENT

(71) Applicant: SAMSUNG ELECTRONICS CO., LTD., Suwon-si, Gyeonggi-Do (KR)

(72) Inventors: Dong-Hoon Jeong, Changwon-si (KR); Woo-Jung Sun, Seoul (KR); Kwang-Jin Lee, Hwaseong-si (KR); Jae-Yun Lee, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/612,640

(22) Filed: Feb. 3, 2015

(65) Prior Publication Data
US 2015/0221369 A1    Aug. 6, 2015

(30) Foreign Application Priority Data
Feb. 4, 2014  (KR) .................. 10-2014-0012617

(51) Int. Cl.
    *G11C 13/00*    (2006.01)
(52) U.S. Cl.
    CPC ...... *G11C 13/0069* (2013.01); *G11C 13/0004* (2013.01); *G11C 13/0064* (2013.01); *G11C 2213/71* (2013.01); *G11C 2213/72* (2013.01)
(58) Field of Classification Search
    CPC .................................. G11C 13/0002
    USPC ........................................ 365/148
    See application file for complete search history.

(56) References Cited

U.S. PATENT DOCUMENTS

| | | | |
|---|---|---|---|
| 5,930,168 A * | 7/1999 | Roohparvar | G11C 16/10 365/185.03 |
| 7,535,747 B2 | 5/2009 | Lee et al. | |
| 7,573,758 B2 | 8/2009 | Park et al. | |
| 7,746,688 B2 | 6/2010 | Kim et al. | |
| 8,000,132 B2 | 8/2011 | Kang et al. | |
| 8,116,117 B2 | 2/2012 | Cho et al. | |
| 8,289,762 B2 | 10/2012 | Kau et al. | |
| 8,300,449 B2 | 10/2012 | Lin et al. | |
| 8,472,257 B2 | 6/2013 | Dong et al. | |
| 8,488,367 B2 | 7/2013 | Shimotori et al. | |
| 8,526,223 B2 | 9/2013 | Kim et al. | |
| 2006/0087876 A1* | 4/2006 | Cho | G11C 13/0004 365/148 |
| 2009/0161408 A1* | 6/2009 | Tanigami | G11C 13/0007 365/148 |
| 2010/0097842 A1 | 4/2010 | Hwang | |
| 2010/0195418 A1* | 8/2010 | Moon | G06F 12/0246 365/189.16 |
| 2010/0235714 A1* | 9/2010 | Toda | G06F 11/106 714/763 |

(Continued)

*Primary Examiner* — Min Huang
(74) *Attorney, Agent, or Firm* — Volentine & Whitt, PLLC

(57) ABSTRACT

Provided is a driving method of a nonvolatile memory device for performing a write operation using a plurality of consecutive write loops. The driving method includes writing data to a plurality of nonvolatile memory cells during a first write loop, and after the first write loop, writing the data to the plurality of nonvolatile memory cells during a second write loop. A first maximum parallel bit size of the first write loop is n bits. A second maximum parallel bit size of the second write loop is m bits. m is greater than n.

17 Claims, 14 Drawing Sheets

(56) References Cited

U.S. PATENT DOCUMENTS

| | | | |
|---|---|---|---|
| 2011/0002158 A1* | 1/2011 | Muraoka | G11C 13/0007 |
| | | | 365/148 |
| 2011/0205782 A1* | 8/2011 | Costa | G11O 5/02 |
| | | | 365/148 |
| 2012/0243323 A1 | 9/2012 | Dong et al. | |
| 2013/0208528 A1 | 8/2013 | Kwak et al. | |
| 2013/0223131 A1* | 8/2013 | Takagi | G11C 13/0007 |
| | | | 365/148 |
| 2013/0229861 A1* | 9/2013 | Ueda | G11C 11/1673 |
| | | | 365/158 |

\* cited by examiner

FIG. 1

| 1_1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

DRIVING METHOD OF NONVOLATILE MEMORY DEVICE USING VARIABLE RESISTIVE ELEMENT

CROSS-REFERENCE TO RELATED APPLICATION

A claim for priority under 35 U.S.C. §119 is made to Korean Patent Application No. 10-2014-0012617 filed on Feb. 4, 2014, the entire contents of which are hereby incorporated by reference.

BACKGROUND

The present inventive concept relates to a driving method of a nonvolatile memory device using a variable resistive element.

Examples of nonvolatile memory devices that use a resistance material include a phase change random access memory (PRAM), a resistive random access memory (RRAM), a magnetic RAM (MRAM), and the like. A dynamic RAM (DRAM) device or a flash memory device stores data by using an electric charge, while a nonvolatile memory device that uses the resistance material stores data by using a change in a state of a phase change material, such as a chalcogenide alloy, a change in resistance of a variable resistive material, and a change in resistance of a magnetic tunnel junction (MTJ) thin film due to a magnetization state of a ferromagnetic substance.

In the following description, a phase change memory is used as an example. The state of the phase change material is changed to a crystal state or an amorphous state while being cooled down after a heating process. Since the phase change material in the crystal state has low resistance, and the phase change material in the amorphous state has high resistance, the crystal state may for example be defined as set data or 0 data, and the amorphous state may for example be defined as reset data or 1 data.

SUMMARY

Embodiments of the inventive concept provide a driving method of a nonvolatile memory device having an improved write speed.

According to an embodiment of inventive concept, there is provided a driving method of a nonvolatile memory device for performing a write operation using a plurality of consecutive write loops. The driving method includes writing data to a plurality of nonvolatile memory cells during a first write loop, and after the first write loop, writing the data to the plurality of nonvolatile memory cells during a second write loop. A first maximum parallel bit size of the first write loop is n bits. A second maximum parallel bit size of the second write loop is m bits, where m is greater than n.

According to another embodiment of the inventive concept, there is provided a driving method of a nonvolatile memory device which includes receiving a write command as an input, determining a first maximum parallel bit size of a first write loop or a second maximum parallel bit size of a second write loop based on whether external power is used or based on whether a skewed method is used, writing data to a plurality of nonvolatile memory cells during the first write loop, and writing the data to the plurality of nonvolatile memory cells during the second write loop. A first maximum parallel bit size of the first write loop is n bits. A second maximum parallel bit size of the second write loop is m bits, where m is greater than n.

BRIEF DESCRIPTION OF THE DRAWINGS

The above and other features and advantages of the inventive concept will become more apparent in view of the following description with reference to the attached drawings in which:

FIG. 1 is a block diagram of a nonvolatile memory device according to some embodiments of the inventive concept.

DETAILED DESCRIPTION

Figure 2:
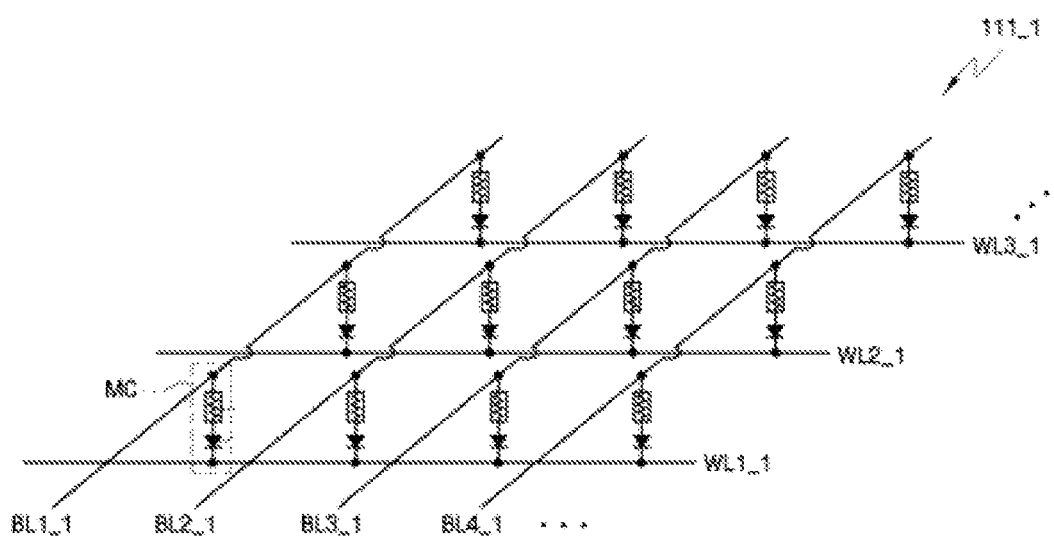
FIGS. 2 and 3 illustrate an example of a memory cell array shown in FIG. 1.

The inventive concept will now be described more fully hereinafter with reference to the accompanying drawings, in which preferred embodiments of the inventive concept are shown. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

The inventive concept will be described with reference to perspective views, cross-sectional views, and/or plan views, in which preferred embodiments of the inventive concept are shown. Thus, the profile of an exemplary view may be modified according to manufacturing techniques and/or allowances. That is, the embodiments of the inventive concept are not intended to limit the scope of the inventive concept but cover all changes and modifications that can be caused due to a change in manufacturing process. Thus, regions shown in the drawings are illustrated in schematic form and the shapes of the regions are presented simply by way of illustration and not as a limitation.

FIG. 1 is a block diagram of a nonvolatile memory device according to some embodiments of the inventive concept. For the sake of a convenient explanation, a nonvolatile memory device including sixteen memory banks is exemplified in FIG. 1, but aspects of the inventive concept are not limited thereto.

Referring to FIG. 1, the nonvolatile memory device according to the embodiments of the inventive concept may include a memory cell array, a plurality of sense amplifiers & write drivers SA/WD(2_1) to SA/WD(2_8), and a peripheral circuit region (PERIPHERY) 3.

The memory cell array may include a plurality of memory banks 1_1 to 1_16. Each of the plurality of memory banks 1_1 to 1_16 may include a plurality of memory blocks BLK0 to BLK7, and each of the plurality of memory blocks BLK0 to BLK7 may include a plurality of nonvolatile memory cells arranged in a matrix configuration. In the embodiments of the inventive concept, each of eight memory blocks arranged in each of the sixteen memory banks 1_1 to 1_16 are exemplified in FIG. 1, but aspects of the inventive concept are not limited thereto.

The nonvolatile memory cells may store data using a variable resistive element. For example, when the nonvolatile memory cell is a PRAM cell, it may include a variable resistive element (GST) having a phase change material and an access element (D) controlling a current that flows through the variable resistive element GST. Here, the access element D may be a diode or a transistor connected in series to the variable resistive element GST. Various kinds of materials, such as GaSb, InSb, InSe, Sb2Te3 and GeTe in which two elements are chemically combined with each other, GeSbTe, GaSeTe, InSbTe, $SnSb_2Te_4$ and InSbGe in which three elements are chemically combined with one another, and AgInSbTe, (GeSn)SbTe, GeSb(SeTe) and $Te_{81}Ge_{15}Sb_2S_2$ in which four elements are chemically combined with one another, may be used as the phase change material. Among them, GeSbTe that contains germanium (Ge), antimony (Sb), and tellurium (Te) may be typically used for the variable resistive element GST.

Meanwhile, when the nonvolatile memory cell is the RRAM cell, the variable resistive element GST may include, for example, NiO or perovskite. The perovskite may be a combination of manganite ($Pr_{0.7}Ca_{0.3}MnO_3$, $Pr_{0.5}Ca_{0.5}MnO_3$, PCMO, LCMO, or the like), titanate (STO: Cr), zirconate (SZO:Cr, $Ca_2Nb_2O_7$:Cr, and $Ta_2O_5$:Cr), or the like. In particular, a filament may be formed in the variable resistive element GST, which serves as a current path of a cell current that flows through the nonvolatile memory cell.

In addition, although not shown in detail, a row select circuit and a column select circuit for designating rows and columns of the resistive memory cell to read/write are disposed to correspond to the memory banks 1_1 to 1_16.

The plurality of sense amplifiers & write drivers SA/WD (2_1) to SA/WD(2_8) are disposed to correspond to two of the memory banks 1_1 to 1_16 in order to perform read and write operations in the corresponding memory banks. In embodiments of the inventive concept, the plurality of sense amplifiers & write drivers SA/WD(2_1) to SA/WD(2_8) corresponding to two of the memory banks 1_1 to 1_16 are exemplified, but aspects of the inventive concept are not limited thereto. That is to say, the plurality of sense amplifiers & write drivers SA/WD(2_1) to SA/WD(2_8) may also be disposed to correspond to one or four memory banks.

A plurality of logic circuit blocks and a voltage generator for operating the column select circuit, the row select circuit and the plurality of sense amplifiers & write drivers SA/WD (2_1) to SA/WD(2_8) may be disposed in the peripheral circuit region 3.

Figure 3:
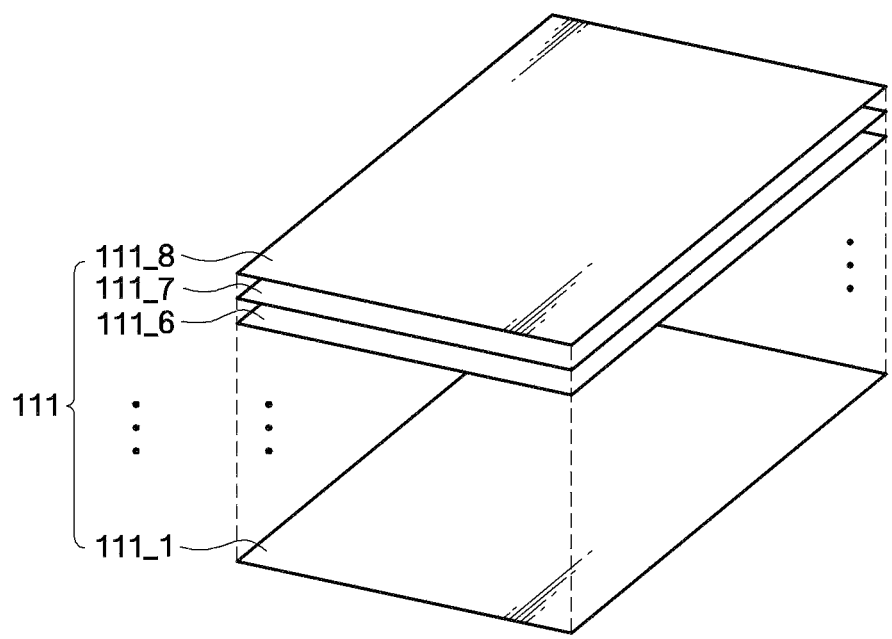

FIGS. 2 and 3 illustrate an example of a memory cell array shown in FIG. 1.

First, referring to FIG. 2, a memory cell array 111_1 may have a cross point structure. The cross point structure means a structure in which a memory cell is formed at an intersection of a line and another line. For example, bit lines BL1_1 to BL4_1 extend in a first direction, and word lines WL1_1 to WL3_1 extend in a second direction so as to cross the bit lines BL1_1 to BL4_1. Nonvolatile memory cells MC may be formed at intersections of the respective bit lines BL1_1 to BL4_1 and the respective word lines WL1_1 to WL3_1.

In addition, as shown in FIG. 3, a plurality of memory cell arrays 111_1 to 111_8 may have a three-dimensionally (3D) stacked structure. In FIG. 3, for example, eight memory cell arrays 111_1 to 111_8 are stacked, but aspects of the inventive concept are not limited thereto. Here, each of the memory cell arrays 111_1 to 111_8 may include a plurality of memory cell groups and/or a plurality of redundant memory cell groups. Each of the memory cell arrays 111_1 to 111_8 may have a cross point structure shown in FIG. 2, but aspects of the inventive concept are not limited thereto.

Figure 4:
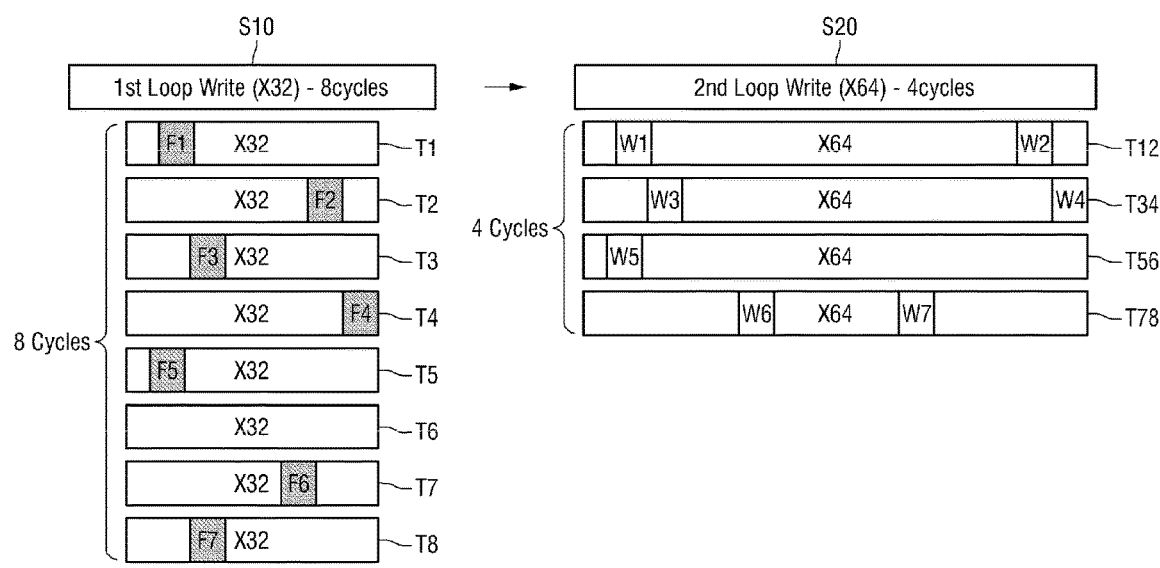
FIG. 4 is a conceptual diagram of a driving method of a nonvolatile memory device according to an embodiment of the inventive concept.
Figure 5:
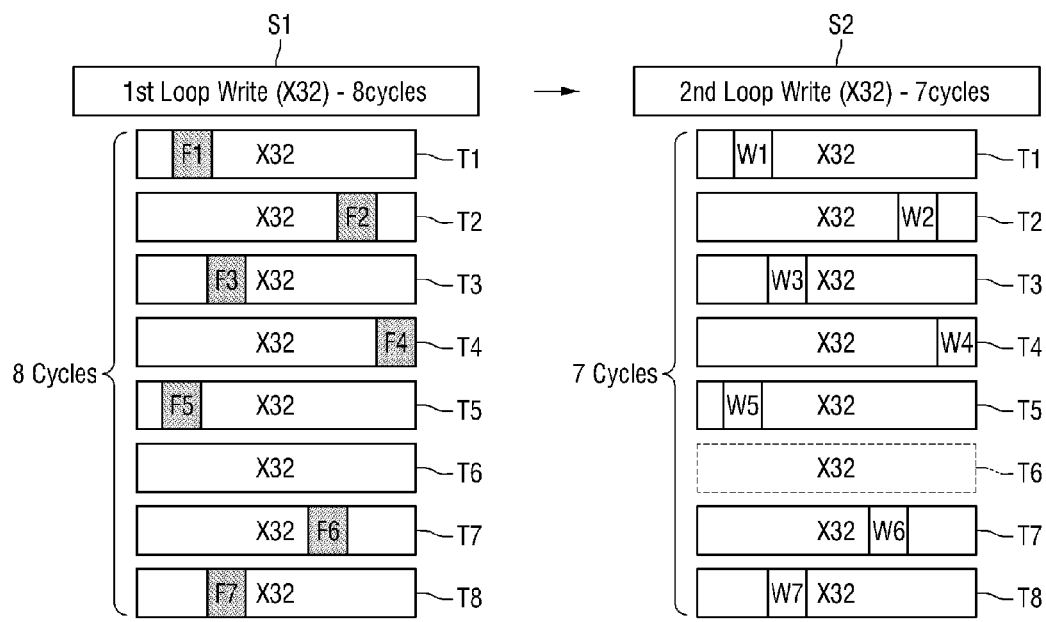
FIG. 5 comparatively illustrates effects of the driving method shown in FIG. 4.

FIG. 4 is a conceptual diagram of a driving method of a nonvolatile memory device according to an embodiment of the inventive concept, and FIG. 5 comparatively illustrates effects of the driving method shown in FIG. 4.

First, referring to FIG. 5, a write operation may be performed in a plurality of consecutive write loops. Each of the plurality of write loops may include at least one write cycle.

For example, when a data size is 256 bits and a first maximum parallel bit size of a write loop S1 is 32 bits, data is written through eight write cycles T1 to T8 (∵32×8=256). A maximum parallel bit size means the number of nonvolatile memory cells that can be simultaneously written.

Next, a failed bit is detected in a verify read operation. For example, it is assumed that seven failed bits F1 to F7 are generated among the plurality of nonvolatile memory cells corresponding to the write cycles T1 to T8.

Next, the detected failed bit may be rewritten in a write loop S2 (see W1 to W7). Here, if a second maximum parallel bit size of the write loops S2 is 32 bits, the data may be rewritten through seven write cycles T1 to T5, T7 and T8. Since the plurality of nonvolatile memory cells corresponding to the write cycle T6 of the write loop S1 are all verification-passed, a rewrite operation is not necessarily performed on the plurality of nonvolatile memory cells corresponding to the write cycle T6.

That is to say, fifteen write cycles (=8+7) may be performed in two write loops S1 and S2.

On the other hand, referring to FIG. 4, a write operation of a nonvolatile memory device according to an embodiment of the inventive concept may be performed in a plurality of consecutive write loops. In addition, each of the plurality of consecutive write loops may include at least one write cycle. In FIG. 4, two write loops, i.e., a first write loop S10 and a second write loop S20, are illustrated by way of example. In the first write loop S10, data is written for the first time during a write period, and in the second write loop S20, failed bits of the first write loop S10 are rewritten. Even after the second write loop S20, a verify read operation and a rewrite operation may further be iteratively performed. That is to say, even after the second write loop S20, several write loops may further be performed.

For example, when a data size is 256 bits and a first maximum parallel bit size of the first write loop S10 is 32 bits, the data may be written through the first to eighth write cycles T1 to T8 (∵32×8=256).

Next, the failed bits may be detected in a verify read operation. For example, it is assumed that seven failed bits F1 to F7 are generated among the plurality of nonvolatile memory cells corresponding to the first to eighth write cycles T1 to T8.

Next, the detected failed bits may be rewritten in the second write loop S20 (see W1 to W7). A magnitude of a write current used during the second write loop S20 is larger than that of a write current used during the first write loop S10. Here, if a second maximum parallel bit size of the second write loop S20 is 64 bits, the data may be rewritten through four write cycles T12, T34, T56 and T78 (∵64×4=256). In addition, for example, the data may be rewritten through two write cycles T1 and T2, as shown in FIG. 5, which may be merged into one write cycle, i.e., the write cycle T12, as shown in FIG. 4. In other words, while the first nonvolatile memory cell is written through the first write cycle T1 in the first write loop S10 and the second nonvolatile memory cell is written through the second write cycle T2 in the first write loop S10, the first and second nonvolatile memory cells may be written through the same write cycle T12 in the second write loop S20.

That is to say, twelve write cycles (=8+4) may be performed in the first and second write loops S10 and S20. The total number of write cycles can be reduced by increasing the second maximum parallel bit size more than the first maximum parallel bit size. While fifteen write cycles in total are required to perform the driving method shown in FIG. 5, twelve write cycles are required to perform the driving method shown in FIG. 4.

A maximum parallel bit size may be determined according to the magnitude of the write current. In other words, the number of nonvolatile memory cells that can be concurrently written is determined in consideration of the magnitude of the maximum write current provided by the nonvolatile memory device. For example, assuming that the maximum write current provided by the nonvolatile memory device is 100%, the number of nonvolatile memory cells that can be concurrently written may be so determined to use 50% of the maximum write current. In an abnormal situation, the remaining 50% of the maximum write current may serve as a buffer.

In addition, the nonvolatile memory cells rewritten during the second write loop S20 are cells detected as the failed bits in the first write loop S10. That is to say, the number of nonvolatile memory cells rewritten during the second write loop S20 may be noticeably smaller than the number of nonvolatile memory cells written during the first write loop S10.

Therefore, even if the second maximum parallel bit size of the second write loop S20 is increased, compared to the first maximum parallel bit size of the second write loop S20, a heavy burden may not be laid on the nonvolatile memory device. On the other hand, as described above, a time required for a write operation of the nonvolatile memory device can be considerably reduced.

Therefore, in the driving method of the nonvolatile memory device according to an embodiment of the inventive concept, the first maximum parallel bit size of the first write loop S10 is n bits, where n is a natural number. The second maximum parallel bit size of the second write loop S20 performed after the first write loop S10 is m bits that are greater than n bits, where m is a natural number. In FIG. 4, the second maximum parallel bit size of 2 n bits is exemplified, but aspects of the inventive concept are not limited thereto. In such a manner, the write operation time of the nonvolatile memory device can be greatly reduced.

Figure 6:
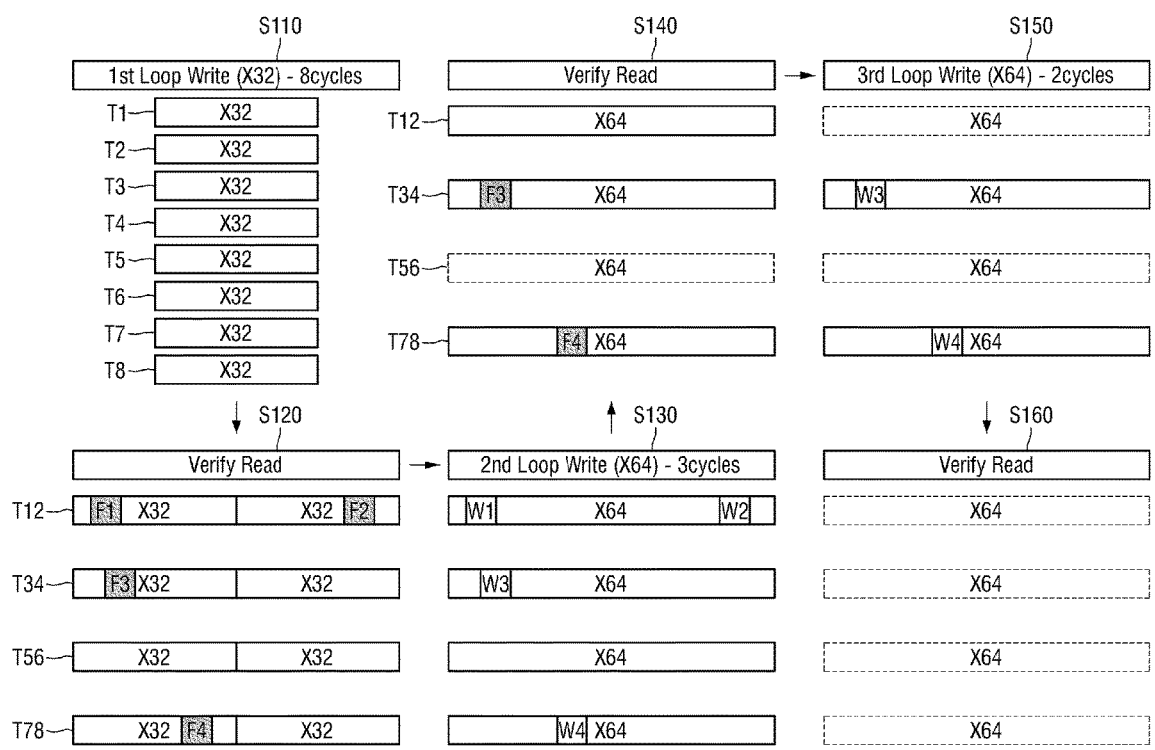
FIG. 6 is a conceptual diagram of a driving method of a nonvolatile memory device according to another embodiment of the inventive concept.

FIG. 6 is a conceptual diagram of a driving method of a nonvolatile memory device according to another embodiment of the inventive concept.

For the sake of convenient explanation, the following description will focus on the content that has not been described with reference to FIGS. 4 and 5.

Referring to FIG. 6, during a first write loop S110, data may be written through first to eighth write cycles T1 to T8. Here, a first maximum parallel bit size of a first write loop S110 may be 32 bits.

Next, failed bits may be detected in a verify read loop S120. Here, it is assumed that four failed bits F1 to F4, for example, are detected.

Next, the detected failed bits F1 to F4 may be rewritten in a second write loop S130 (see W1 to W4). Here, a second maximum parallel bit size of a second write loop S130 may be 64 bits. During the second write loop S130, the data may be written through three write cycles T12, T34 and T78. Since no failed bit is detected in write cycles T5 and T6 of the first write loop S110, a write cycle T56 obtained by merging the write cycles T5 and T6 may not be performed.

Then, the failed bits may be detected in a verify read loop S140. Here, it is assumed that two failed bits F3 and F4, for example, are detected.

Next, the detected failed bits F3 and F4 may be rewritten in a third write loop S150 (see W3 and W4). Here, a third maximum parallel bit size of the third write loop S150 may be 64 bits. The third maximum parallel bit size and the second maximum parallel bit size may be equal to each other. During the third write loop S150, the data may be written through two write cycles T34 and T78, because no failed bit is detected in the write cycle T12 of the second write loop S130.

Next, the failed bits may be detected in a verify read loop S160. Since no further failed bit is detected, the write operation may be completed.

Consequently, thirteen write cycles may be performed in the three write loops S110, S130 and S150.

Therefore, in the driving method of the nonvolatile memory device according to another embodiment of the inventive concept, the first maximum parallel bit size of the first write loop S110 is n bits, where n is a natural number. The second maximum parallel bit size of the second write loop S130 performed after the first write loop S110 is m bits that are greater than n bits, where m is a natural number. The third maximum parallel bit size of the third write loop S150 performed after the second write loop S130 may be m bits.

Figure 7:
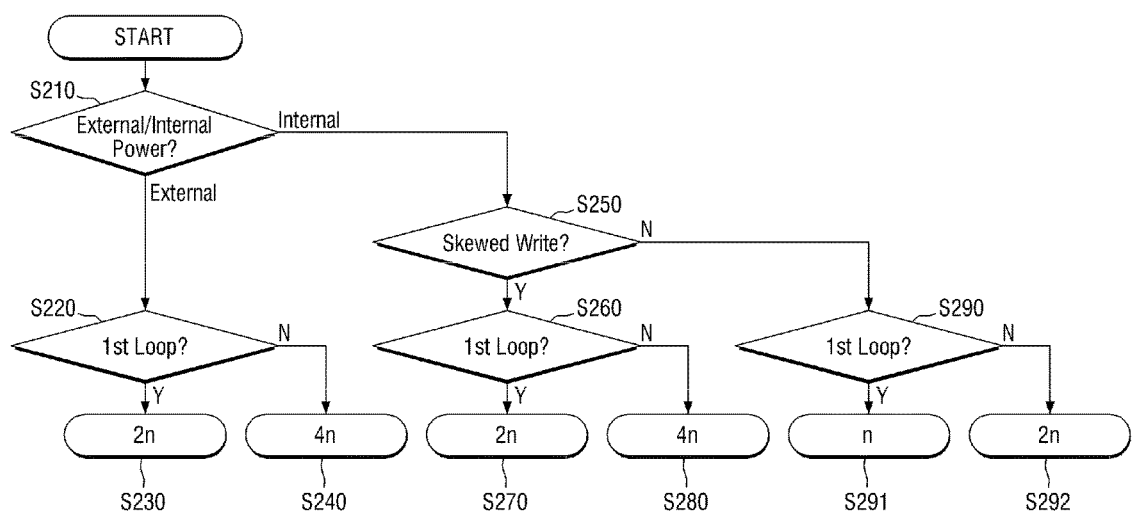
FIG. 7 is a conceptual diagram of a driving method of a nonvolatile memory device according to still another embodiment of the inventive concept.

FIG. 7 is a conceptual diagram of a driving method of a nonvolatile memory device according to still another embodiment of the inventive concept. For the sake of convenient explanation, the following description will focus on the content that has not been described with reference to FIGS. 4 and 5.

Referring to FIG. 7, it is determined whether external power or internal power is used in performing a write operation (S210). As described above, a maximum parallel bit size is associated with an allowable maximum write current. The maximum parallel bit size when the external power is used is much larger than the maximum parallel bit size when the internal power is used.

When the external power is used, it is determined whether the write operation is performed in a first write loop (S220).

The maximum parallel bit size of the first write loop when the external power is used is determined to be 2 n (S230). In addition, if the write operation is not performed in the first write loop (that is, if multiple write loops are performed after the first write loop), the maximum parallel bit size is determined to be 4 n (S240).

When the internal power is used, it is determined whether the write operation is performed based on a skewed method (S250). In the skewed method, multiple write currents may be supplied with a slight time difference in order to prevent maximum values of the multiple write currents from overlapping with each other. Here, the multiple write currents may be supplied to a plurality of nonvolatile memory cells that are required to be concurrently written. According to an unskewed method, however, the maximum values of the multiple write currents supplied to the plurality of nonvolatile memory cells that are required to be concurrently written may overlap with each other.

If the write operation is not performed based on the skewed method (that is, if the write operation is performed based on the unskewed method, it is determined whether the write operation is performed in the first write loop (S290).

The maximum parallel bit size of the first write loop performed using the internal power and performed based on the unskewed method is determined to be n (S291). If the write operation is not performed in the first write loop (that is, if multiple write loops are performed after the first write loop), the maximum parallel bit size is determined to be 2 n (S292).

When the write operation is performed based on the skewed method, it is determined whether the write operation is performed in the first write loop (S260).

The maximum parallel bit size of the first write loop performed using the internal power and performed based on the skewed method is determined to be 2 n (S270). If the write operation is not performed in the first write loop (that is, if multiple write loops are performed after the first write loop), the maximum parallel bit size is determined to be 4 n (S280).

As described above, the maximum parallel bit size may be determined according to whether the external power is used or whether the skewed method is used, but aspects of the inventive concept are not limited thereto.

In addition, for the sake of convenient explanation, the maximum parallel bit size of a multiple of n, e.g., n, 2 n, 4 n, etc. is exemplified, but aspects of the inventive concept are not limited thereto.

That is to say, assuming that the write operation is performed using the internal power, that a first maximum parallel bit size is n bits, and that a second maximum parallel bit size is m bits, the first maximum parallel bit size when the write operation is performed using the external power is v bits that are greater than n bits, where v is a natural number, and the second maximum parallel bit size is w bits that are greater than m bits, where w is a natural number.

In addition, assuming that the write operation is performed based on the unskewed method, that the first maximum parallel bit size is n bits, and that the second maximum parallel bit size is m bits, the first maximum parallel bit size when the write operation is performed based on the skewed method is x bits that are greater than n bits, where x is a natural number, and the second maximum parallel bit size is y bits that are greater than m bits, where y is a natural number.

Figure 8:
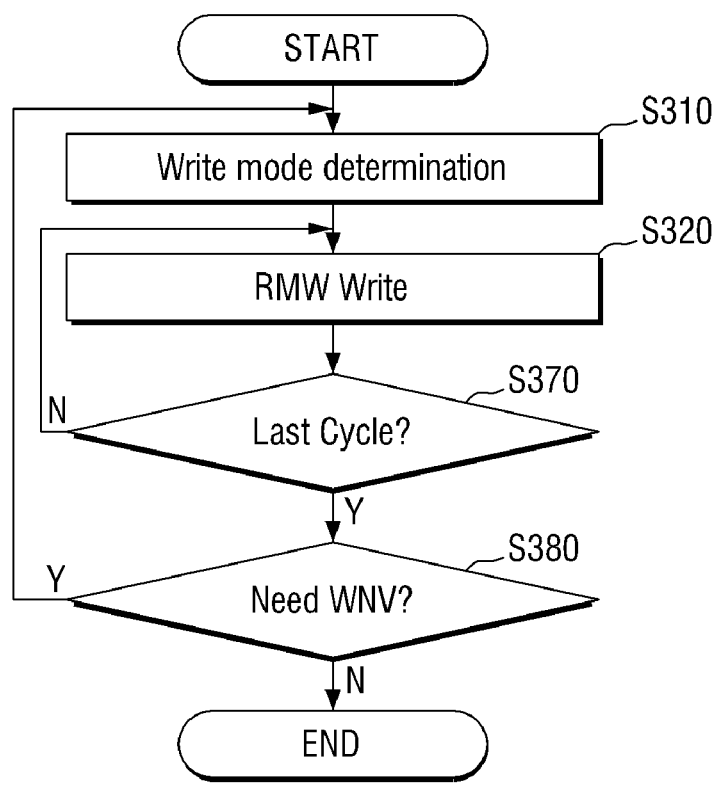
FIG. 8 is a conceptual diagram of a driving method of a nonvolatile memory device according to still another embodiment of the inventive concept.

FIG. 8 is a conceptual diagram of a driving method of a nonvolatile memory device according to still another embodiment of the inventive concept. For the sake of convenient explanation, the following description will focus on the content that has not been described with reference to FIG. 7.

Referring to FIG. 8, a write command is input and a write mode is determined (S310). In the determining of the write mode, a maximum parallel bit size is determined That is to say, as described above, a first maximum parallel bit size of a first write loop and a second maximum parallel bit size of a second write loop may be differently determined. For example, the first maximum parallel bit size and the second maximum parallel bit size may be determined according to whether external power is used or whether a skewed method is used. When necessary, the first maximum parallel bit size and the second maximum parallel bit size may be determined as being the same with each other.

A read modification write (RMW) operation may be performed (S320). In detail, in the RMW operation, data to be written may be compared with data stored in a memory core, and only different bits may be written. That is to say, reading the data stored in a memory core, comparing the read data with the data stored in a write buffer, and generating a write pulse to write only different bits, are required in performing the RMW operation.

The inventive concept is described with regard to a case where the RMW operation is employed by way of an example, but aspects of the inventive concept are not limited thereto.

After the RMW operation is completed, it may be checked whether the write cycle that is currently performed is the last one (S370). If the write cycle that is currently performed is not the last one, the RMW operation may be repeatedly performed. If the write cycle that is currently performed is the last one, the procedure may go to the next step.

It is determined whether a write and verify (WNV) operation is needed (S380). If the WNV operation is needed, a write mode may be determined again (S310). If the WNV operation is not needed, the loop may be terminated.

Figure 9:
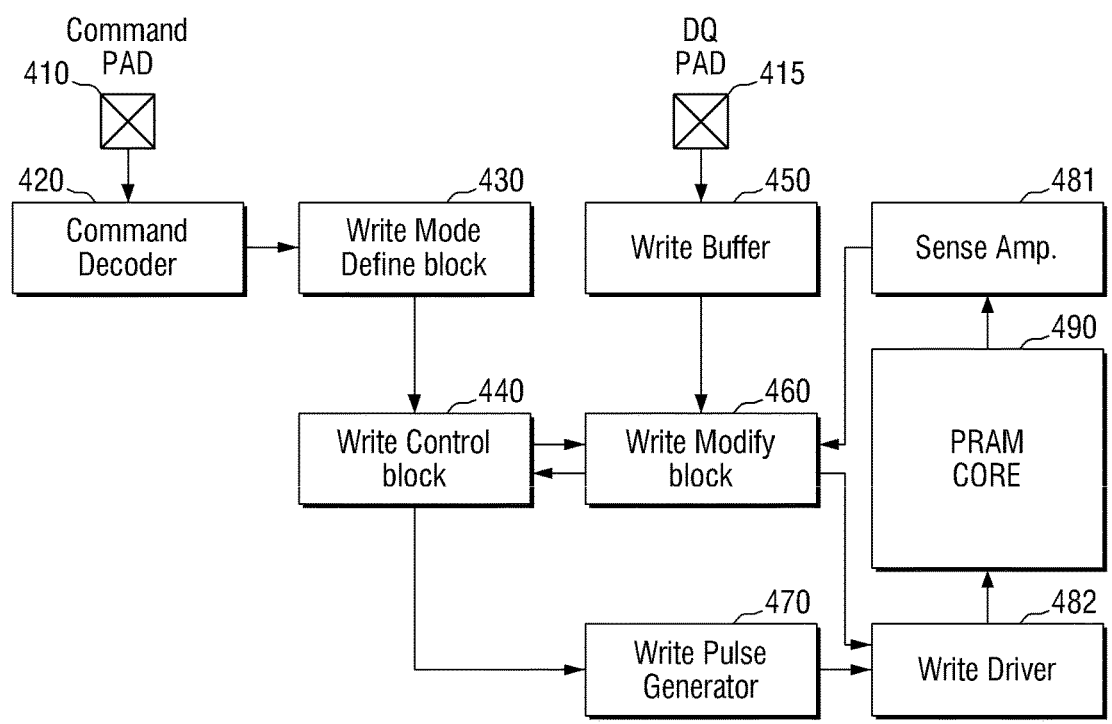
FIG. 9 is an exemplary block diagram of a nonvolatile memory device according to still another embodiment of the inventive concept.

FIG. 9 is an exemplary block diagram of a nonvolatile memory device according to still another embodiment of the inventive concept. Specifically, FIG. 9 is an exemplary block diagram implementing the driving method shown in FIG. 8.

Referring to FIG. 9, the nonvolatile memory device may include a command pad 410, a data pad 415, a command decoder 420, a write mode define block 430, a write control block 440, a write buffer 450, a write modify block 460, a write pulse generator 470, a sense amplifier 481, a write driver 482, and a PRAM core 490.

A command, such as a read command or a write command, may be input through the command pad 410.

The command decoder 420 may decode the command to notify the write mode define block 430 of generation of the write command.

As described above with reference to FIGS. 7 and 8, the write mode define block 430 may determine the write mode associated with a maximum parallel bit size. For example, a first maximum parallel bit size and a second maximum parallel bit size may be determined according to whether external power is used or whether a skewed method is used.

Multiple pieces of data may be input through the data pad 415.

The input data may be temporarily stored in the write buffer 450.

The sense amplifier 481 may read the data from the PRAM core 490.

The write modify block 460 may compare the data read from the sense amplifier 481 with the data stored in the write buffer 450, and may notify the write driver 482 and/or the write control block 440 of the comparison result.

The write control block 440 may control multiple loops and multiple write cycles of the write operation according to the determined write mode and the comparison result. In addition, the write control block 440 may control starting and ending of the write operation. Further, the write control block 440 may control the write pulse generator 470.

The write pulse generator 470 may generate a write pulse according to information provided from the write control block 440. The write driver 482 may write the data to the PRAM core 490 using the generated write pulse.

FIGS. 10 to 14 illustrate memory systems according to various embodiments of the inventive concept. Specifically, FIGS. 10 to 14 illustrate memory systems using nonvolatile memory devices according to various embodiments of the inventive concept.

Figure 10:
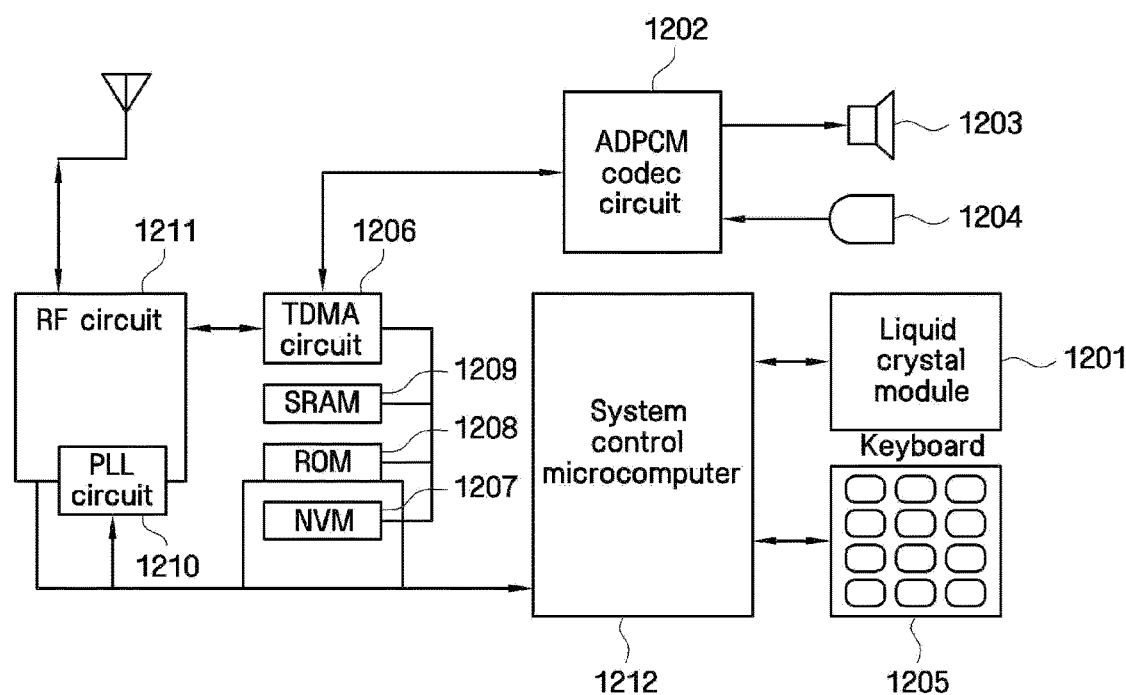
FIG. 10 is an exemplary block diagram of a cellular phone system adopting a nonvolatile memory device according to embodiments of the inventive concept.

FIG. 10 is an exemplary block diagram of a cellular phone system adopting a nonvolatile memory device according to embodiments of the inventive concept.

Referring to FIG. 10, the cellular phone system may include an adaptive differential pulse code modulation (AD-PCM) codec circuit 1202 that compresses sound or decompresses compressed sound, a speaker 1203, a microphone 1204, a time division multiple access (TDMA) circuit 1206 that time-divisionally multiplexes digital data, a phase-locked loop (PLL) circuit 1210 that sets a carrier frequency of a radio signal, and a radio frequency (RF) circuit 1211 that transmits or receives a radio signal.

In addition, the cellular phone system may include various kinds of memory devices, for example, a nonvolatile memory device 1207, a read only memory (ROM) 1208, and a static RAM (SRAM) 1209. Any of the nonvolatile memory devices that are described above according to some embodiments of the inventive concept may be used as the nonvolatile memory device 1207, and the nonvolatile memory device 1207 may store an ID number, for example. The ROM 1208 may store a program. The SRAM 1209 may serve as a working area for a system control microcomputer 1212 or may temporarily store data. Here, the system control microcomputer 1212 may be a processor controlling a write operation and a read operation of the nonvolatile memory device 1207.

Figure 11:
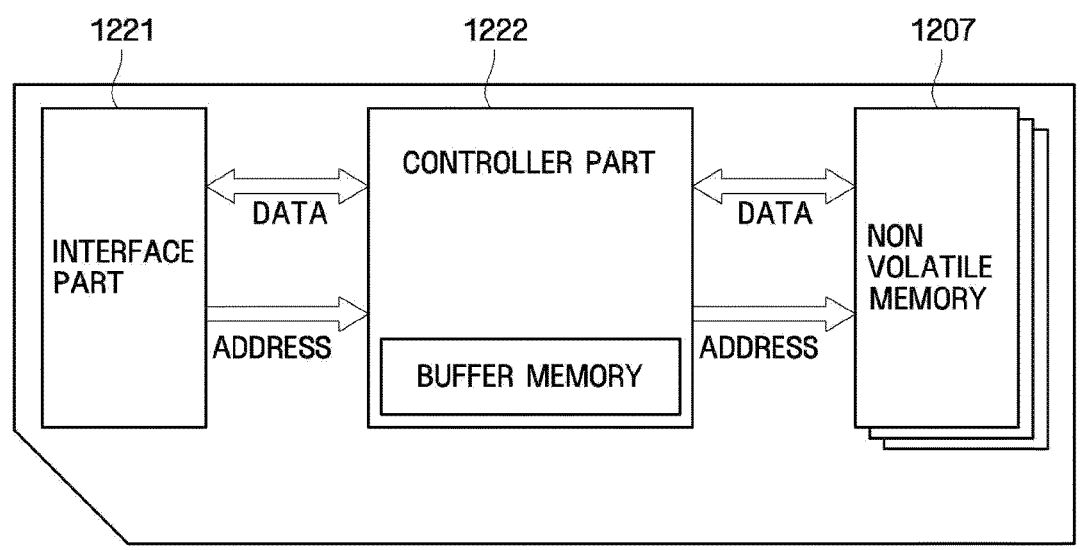
FIG. 11 is an exemplary block diagram of a memory card adopting a nonvolatile memory device according to embodiments of the inventive concept.

FIG. 11 is an exemplary block diagram of a memory card adopting a nonvolatile memory device (NVM) according to embodiments of the inventive concept.

Examples of the memory card may include a MultiMedia card (MMC), a Secure Digital (SD) card, a multiuse card, a micro SD card, a memory stick, a compact SD card, an ID card, a Personal Computer Memory Card International Association (PCMCIA) card, a Solid State Driver (SSD) card, a chipcard, a smartcard, a Universal Serial Bus (USB) card, and so on.

Referring to FIG. 11, the memory card may include at least one of an interface part 1221 that performs interfacing with an external device, a controller part 1222 that has a buffer memory and controls the operation of the memory card, and the nonvolatile memory 1207 according to some embodiments of the inventive concept. The controller part 1222 may be a processor that controls a write operation and a read operation of the nonvolatile memory 1207. In detail, the controller part 1222 is coupled to the nonvolatile memory 1207 and the interface part 1221 through a data bus DATA and an address bus ADDRESS.

Figure 12:
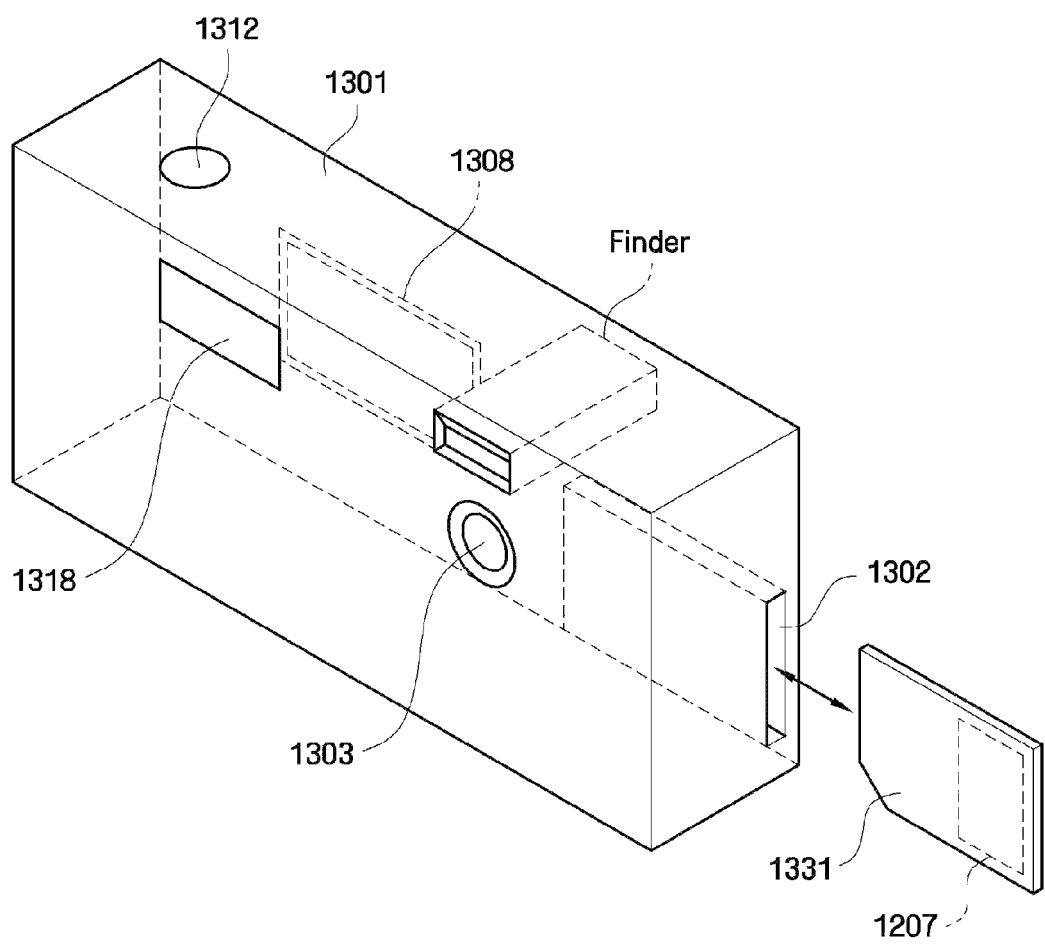
FIG. 12 is an exemplary block diagram of a digital still camera adopting a nonvolatile memory device according to embodiments of the inventive concept.

FIG. 12 is an exemplary block diagram of a digital still camera adopting a nonvolatile memory (NVM) according to embodiments of the inventive concept.

Referring to FIG. 12, the digital still camera may include a body 1301, a slot 1302, a lens 1303, a display 1308, a shutter button 1312, and a strobe 1318. In particular, a memory card 1331 may be inserted into the slot 1302, and the memory card 1331 may include at least one nonvolatile memory device 1207 according to some embodiments of the inventive concept.

If the memory card 1331 is a contact type of memory card, the memory card 1331 may contact with a particular electric circuit on a printed circuit board when the memory card 1331 is inserted into the slot 1302. If the memory card 1331 is a non-contact type of memory card, the memory card 1331 may communicate with the particular electric circuit through a radio signal.

Figure 13:
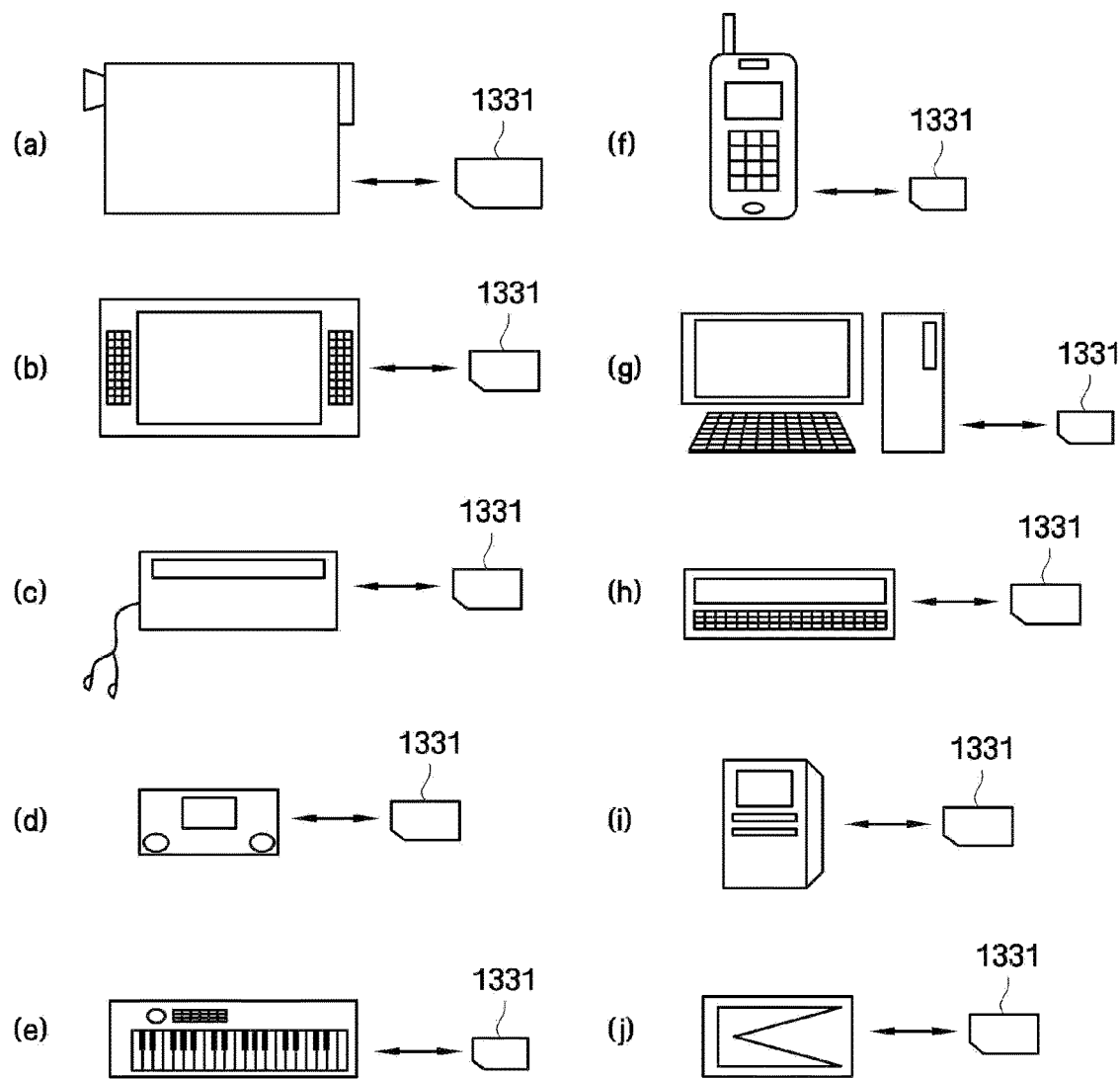
FIG. 13 illustrates various systems adopting the memory card shown in FIG. 11.

FIG. 13 illustrates various systems adopting the memory card shown in FIG. 11.

Referring to FIG. 13, the memory card 1331 may be applied to (a) a video camera, (b) a television, (c) an audio device, (d) a game device, (e) an electronic musical instrument, (f) a cellular phone, (g) a computer, (h) a personal digital assistant (PDA), (i) a voice recorder, (j) a PC card, and so on.

Figure 14:
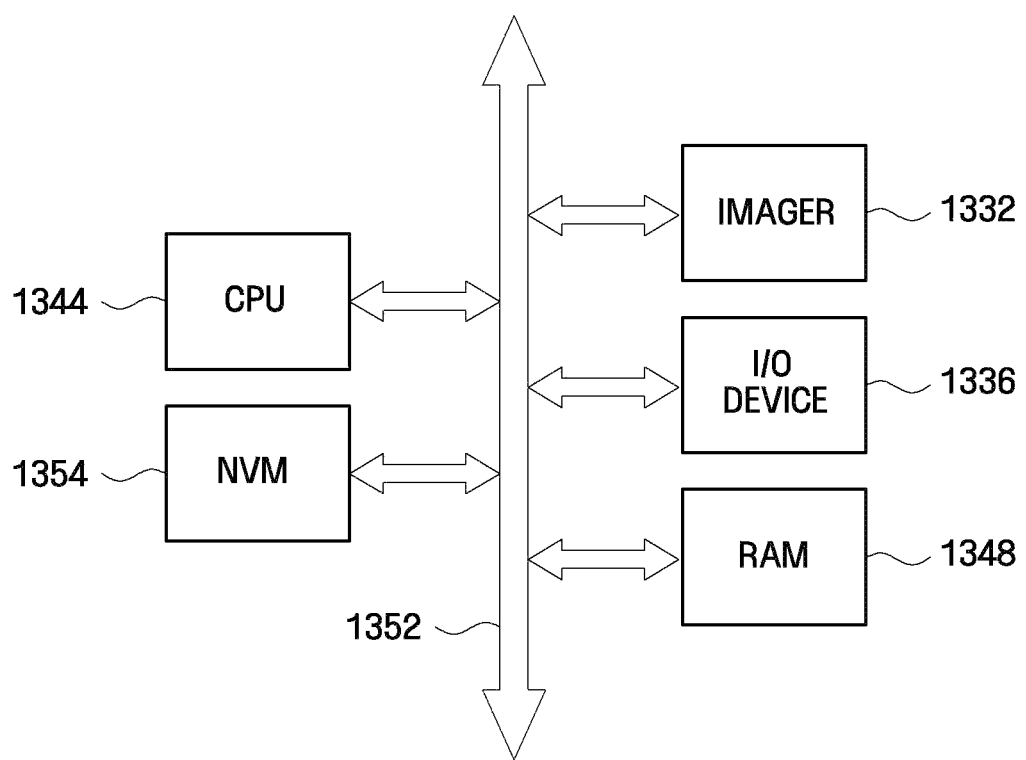
FIG. 14 is an exemplary block diagram of an image sensor system adopting a nonvolatile memory device according to embodiments of the inventive concept.

FIG. 14 is an exemplary block diagram of an image sensor system adopting a nonvolatile memory device according to embodiments of the inventive concept.

Referring to FIG. 14, the image sensor system may include an imager 1332, an input/output (I/O) device 1336, a random access memory (RAM) 1348, a central processing unit (CPU) 1344, and a nonvolatile memory (NVM) 1354 according to some embodiments of the inventive concept.

Each component of the image sensor, including the imager 1332, the I/O device 1336, the RAM 1348, the CPU 1344 and the NVM 1354 may communicate with one another through a bus 1352. The imager 1332 may include a photo sensing element, such as a photogate, a photodiode, or the like. Each component of the image sensor may be incorporated into a chip with a processor, or may be formed with a chip separate from a processor.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the inventive concept be considered in all respects as illustrative and not restrictive, reference being made to the appended claims rather than the foregoing description to indicate the scope of the inventive concept.

What is claimed is:

1. A method of driving a nonvolatile memory device, comprising:
    writing data to a plurality of nonvolatile memory cells during a first write loop among a plurality of consecutive write loops; and
    after the first write loop, writing the data to the plurality of nonvolatile memory cells during a second write loop among the plurality of consecutive write loops,
    wherein a maximum parallel bit size of the second write loop is greater than a maximum parallel bit size of the first write loop, the maximum parallel bit size being a number of nonvolatile memory cells that can be simultaneously written,
    the first write loop includes a first write cycle and a second write cycle,
    the plurality of nonvolatile memory cells include a first nonvolatile memory cell and a second nonvolatile memory cell,
    the first nonvolatile memory cell is written through the first write cycle and the second nonvolatile memory cell is written through the second write cycle, and
    the first and second nonvolatile memory cells are written through a same write cycle in the second write loop.

2. The method of claim 1, wherein the maximum parallel bit size of the second write loop is twice as large as the maximum parallel bit size of the first write loop.

3. The method of claim 1, wherein after the second write loop, writing the data to the plurality of nonvolatile memory cells during a third write loop among the plurality of consecutive write loops, a maximum parallel bit size of the third write loop being the same as the maximum parallel bit size of the second write loop.

4. The method of claim 1, wherein a magnitude of a second write current used during the second write loop is larger than that of a first write current used during the first write loop.

5. The method of claim 1, wherein when internal power is used in a write operation, the maximum parallel bit size of the first write loop is n and the maximum parallel bit size of the second write loop is m, n being an integer, m being an integer greater than n, and
    when external power is used in the write operation, the maximum parallel bit size of the first wire loop is v that is an integer greater than n and the maximum parallel bit size of the second write loop is w that is an integer greater than m.

6. The method of claim 1, wherein when an unskewed method is used in a write operation, the maximum parallel bit size of the first write loop is n and the maximum parallel bit size of the second write loop is m, n being an integer, m being an integer greater than n, and
    when a skewed method is used in the write operation, the maximum parallel bit size of the first write loop is x that is an integer greater than n and the maximum parallel bit size of the second write loop is y that is an integer greater than m.

7. The method of claim 1, wherein the write operation is a read modification write (RMW) operation.

8. The method of claim 1, wherein the nonvolatile memory device is a phase change random access memory (PRAM).

9. A method of driving a nonvolatile memory device, comprising:
    receiving a write command as an input;
    determining a maximum parallel bit size of a first write loop among a plurality of consecutive write loops or a maximum parallel bit size of a second write loop among the plurality of consecutive write loops based on whether external power is used or on whether a skewed method is used;
    writing data to a plurality of nonvolatile memory cells during the first write loop according to the maximum parallel bit size of the first write loop; and
    writing the data to the plurality of nonvolatile memory cells during the second write loop according to the maximum parallel bit size of the second write loop,
    wherein the maximum parallel bit size is a number of nonvolatile memory cells that can be simultaneously written,
    the first write loop includes a first write cycle and a second write cycle,
    the plurality of nonvolatile memory cells include a first nonvolatile memory cell and a second nonvolatile memory cell,
    the first nonvolatile memory cell is written through the first write cycle and the second nonvolatile memory cell is written through the second write cycle, and
    the first and second nonvolatile memory cells are written through a same write cycle in the second write loop.

10. The method of claim 9, wherein the maximum parallel bit size of the second write loop is greater than the maximum parallel bit size of the first write loop.

11. The method of claim 10, wherein when internal power is used in a write operation, the maximum parallel bit size of the first write loop is n and the maximum parallel bit size of the second write loop is m, n being an integer, m being an integer greater than n, and
    when external power is used in the write operation, the maximum parallel bit size of the first write loop is v that is an integer greater than n and the maximum parallel bit size of the second write loop is w that is an integer greater than m.

12. The method of claim 10, wherein when an unskewed method is used in a write operation, the maximum parallel bit size of the first write loop is n and the maximum parallel bit size of the second write loop is m, n being an integer, m being an integer greater than n, and when a skewed method is used in the write operation, the maximum parallel bit size of the first write loop is x that is an integer greater than n and the maximum parallel bit size of the second write loop is y that is an integer greater than m.

13. The method of claim 9, wherein the write operation is a read modification write (RMW) operation.

14. A method of driving a nonvolatile memory device, comprising:

writing data having a plurality of bits to a plurality of nonvolatile memory cells during a first write loop among a plurality of consecutive write loops;

performing a verify-read operation to detect failed bits of the data; and after detecting the failed bits of the data, writing the failed bits of the data to the plurality of nonvolatile memory cells during a second write loop among the plurality of consecutive write loops, wherein a maximum parallel bit size of the second write loop is greater than a maximum parallel bit size of the first write loop, the maximum parallel bit size being a number of nonvolatile memory cells that can be simultaneously written, the first write loop includes a plurality of write cycles, and the second write loop includes one or more write cycles, the first write loop including more write cycles than the second write loop, and the method further comprises receiving a write command and determining a write mode, wherein the determining the write mode includes determining the maximum parallel bit size of the first write loop and the maximum parallel bit size of the second write loop.

15. The method of claim 14, wherein the determining the maximum parallel bit size of the first write loop and the maximum parallel bit size of the second write loop are performed based on whether external power is used or on whether a skewed method is used.

16. The method of claim 14, further comprising performing a read modification write (RMW) operation, wherein the performing the RMW operation includes reading the data stored in a memory core, comparing the read data with data stored in a write buffer, and generating a write pulse to write only different bits.

17. The method of claim 15, wherein if internal power is used in the write operation and an unskewed method is used, the maximum parallel bit size of the first write loop is n and the maximum parallel bit size of the second write loop is m, n being an integer, m being an integer greater than n, and if otherwise, the maximum parallel bit size of the first write loop is v that is an integer greater than n and the maximum parallel bit size of the second write loop is w that is an integer greater than m.

* * * * *